United States Patent
Molas et al.

(10) Patent No.: US 12,087,360 B2
(45) Date of Patent: Sep. 10, 2024

(54) METHOD FOR PROGRAMMING AN ARRAY OF RESISTIVE MEMORY CELLS

(71) Applicants: COMMISSARIAT À L'ÉNERGIE ATOMIQUE ET AUX ÉNERGIES ALTERNATIVES, Paris (FR); WEEBIT NANO LTD, Hod-Hasharon (IL)

(72) Inventors: Gabriel Molas, Grenoble (FR); Alessandro Bricalli, Grenoble (FR); Guiseppe Piccolboni, Verona (IT); Amir Regev, Modiin (IL)

(73) Assignees: COMMISSARIAT A L'ENERGIE ATOMIQUE ET AUX ENERGIES ALTERNATIVES, Paris (FR); WEEBIT NANO LTD, Hod-Hasharon (IL)

( * ) Notice: Subject to any disclaimer, the term of this patent is extended or adjusted under 35 U.S.C. 154(b) by 181 days.

(21) Appl. No.: 17/831,948

(22) Filed: Jun. 3, 2022

(65) Prior Publication Data
US 2022/0392528 A1    Dec. 8, 2022

(30) Foreign Application Priority Data

Jun. 4, 2021   (EP) ..................................... 21177707

(51) Int. Cl.
G11C 13/00        (2006.01)
(52) U.S. Cl.
CPC ...... G11C 13/0069 (2013.01); G11C 13/0064 (2013.01); G11C 2213/79 (2013.01)
(58) Field of Classification Search
CPC ............ G11C 13/0069; G11C 13/0064; G11C 2213/79; G11C 2013/0092; G11C 13/0035; G11C 2013/0071; G11C 2013/0073
(Continued)

(56) References Cited

U.S. PATENT DOCUMENTS

| 2010/0284212 A1* | 11/2010 | Bedeschi | G11C 13/0069 365/163 |
| 2013/0163322 A1* | 6/2013 | Lam | G11C 13/0069 365/163 |

(Continued)

FOREIGN PATENT DOCUMENTS

| JP | 2016024841 A | * | 2/2016 | ............ G06F 11/073 |
| WO | WO 2015/065415 A1 | | 5/2015 | |
| WO | WO 2018/136187 A1 | | 7/2018 | |

OTHER PUBLICATIONS

Extended European Search Report as issued in European Patent Application No. 21177707.3, dated Nov. 24, 2021.

(Continued)

*Primary Examiner* — Michael T Tran
(74) *Attorney, Agent, or Firm* — Pillsbury Winthrop Shaw Pittman LLP

(57) ABSTRACT

A method for programming at least one resistive memory cell of an array of resistive memory cells, includes a sequence of N programming cycles, N being an integer greater than or equal to 2, each programming cycle including a set procedure and a reset procedure, each set procedure including the application of a set technique chosen among a plurality of set techniques, the method including acquiring a bit error ratio value corresponding to each programming cycle for each set technique; and at each programming cycle, applying the set technique having the lowest bit error ratio value corresponding to the programming cycle.

8 Claims, 4 Drawing Sheets

(58) Field of Classification Search
USPC .................................................. 365/148, 158
See application file for complete search history.

(56) References Cited

U.S. PATENT DOCUMENTS

| | | | |
|---|---|---|---|
| 2014/0063907 A1 | 3/2014 | Matsunami | |
| 2014/0226388 A1 | 8/2014 | Khoueir et al. | |
| 2016/0093394 A1* | 3/2016 | Lee | G11C 11/5642 |
| | | | 365/185.12 |
| 2016/0267975 A1 | 9/2016 | Takeuchi | G11C 13/0069 |
| 2016/0336066 A1 | 11/2016 | Lin et al. | |
| 2020/0185030 A1* | 6/2020 | Oh | G11C 13/0069 |
| 2020/0411086 A1* | 12/2020 | Yim | G11C 16/10 |
| 2021/0118518 A1* | 4/2021 | Wu | G11C 29/38 |
| 2021/0134365 A1* | 5/2021 | Lim | H10N 70/826 |
| 2021/0335421 A1* | 10/2021 | Lin | G11C 13/0061 |
| 2021/0407605 A1* | 12/2021 | Lien | H10B 41/10 |
| 2022/0028457 A1* | 1/2022 | Park | G11C 16/32 |
| 2022/0044730 A1* | 2/2022 | Kim | H01L 25/0657 |
| 2022/0101933 A1* | 3/2022 | Choi | G11C 16/08 |
| 2022/0122678 A1* | 4/2022 | Kim | G11C 16/30 |
| 2022/0189567 A1* | 6/2022 | Lee | G11C 11/5671 |
| 2022/0215887 A1* | 7/2022 | Kim | G11C 11/5628 |
| 2022/0293191 A1* | 9/2022 | Singidi | G11C 29/021 |
| 2022/0375514 A1* | 11/2022 | Son | G11C 11/5628 |
| 2022/0392528 A1* | 12/2022 | Molas | G11C 13/0035 |
| 2022/0392538 A1* | 12/2022 | Tak | G11C 16/10 |
| 2023/0044073 A1* | 2/2023 | Kim | G11C 16/3459 |
| 2023/0060312 A1* | 3/2023 | Moschiano | G11C 16/08 |
| 2023/0062706 A1* | 3/2023 | Mun | G11C 16/3427 |
| 2023/0069260 A1* | 3/2023 | Lien | G11C 16/10 |
| 2023/0090656 A1* | 3/2023 | Lim | G11C 16/08 |
| | | | 365/185.22 |
| 2023/0113235 A1* | 4/2023 | Jeong | G11C 16/30 |
| | | | 365/185.11 |
| 2023/0133227 A1* | 5/2023 | Miccoli | G11C 11/5628 |
| | | | 365/189.011 |
| 2023/0154553 A1* | 5/2023 | Lee | G11C 16/24 |
| | | | 365/185.22 |
| 2023/0197183 A1* | 6/2023 | Ko | G11C 16/102 |
| | | | 365/185.09 |
| 2023/0221870 A1* | 7/2023 | Cheon | G11C 16/24 |
| | | | 711/154 |
| 2023/0253050 A1* | 8/2023 | Kim | G11C 16/0483 |
| | | | 365/189.011 |
| 2023/0253058 A1* | 8/2023 | Kim | G11C 16/3459 |
| | | | 365/230.03 |
| 2023/0352108 A1* | 11/2023 | Penzo | G11C 11/5642 |
| 2023/0377643 A1* | 11/2023 | Xu | G11C 16/10 |
| 2023/0420053 A1* | 12/2023 | Tian | G11C 16/26 |
| 2024/0004787 A1* | 1/2024 | Cariello | G06F 12/023 |
| 2024/0021249 A1* | 1/2024 | Gajula | G11C 16/16 |

OTHER PUBLICATIONS

Vianello, E., et al., "Resistive Memories for Ultra-Low-Power embedded computing design," IEEE International Electron Devices Meeting, (2014), 3 pages.

Hayakawa, A., et al., "Resolving Endurance and Program Time Trade-Off of 40nm TaOx-Based ReRAM by Co-Optimizing Verify Cycles, Reset Voltage and ECC Strength", 2017 IEEE International Memory Workshop, May 2017, XP033104990, 4 pages.

* cited by examiner

… …

METHOD FOR PROGRAMMING AN ARRAY OF RESISTIVE MEMORY CELLS

CROSS-REFERENCE TO RELATED APPLICATIONS

This application claims priority to European Patent Application No. 21177707.3, filed Jun. 4, 2021, the entire content of which is incorporated herein by reference in its entirety.

FIELD

The present invention belongs to the technical field of the Resistive Random-Access Memories (ReRAM) comprising an array of resistive memory cells. An aspect of the invention is a method for programming at least a part of an array of resistive memory cells in an efficient manner.

BACKGROUND

A Resistive Random-Access Memory (ReRAM) is a type of rewritable non-volatile memory. It comprises an array of resistive memory cells, each cell comprising a resistive memory element and a selection transistor connected in series with the resistive memory element. The resistive memory element comprises a first electrode and a second electrode separated by a dielectric material layer. The application of an electric potential difference to the two electrodes leads to the formation or the removal of an electrical connection between the two electrodes.

After the electrical connection is formed, the resistive memory cell is in a low resistance state (LRS). This first state is also called ON state or conducting state. When the electrical connection is removed, the resistive memory cell is in a high resistance state (HRS). This second state is also called OFF state or insulating state. The electrical resistance associated to the LRS is called $R_{LRS}$, while the electric resistance associated to the HRS is called $R_{HRS}$.

The existence of these two ON/OFF states makes it possible to use the resistive memory cell as a rewritable non-volatile memory by encoding one bit of information. A memory cell may also be called a memory point.

Several mechanisms may be responsible for the formation of the electrical connection between the two electrodes (see for example the article "Resistive Memories for Ultra-Low-Power Embedded Computing Design" published by E. Vianello et al. in Electron Devices Meeting 2014 IEEE International). For example, in the case of memory cells known as OxRAM (Oxide-based RAM), a conductive filament is formed by oxygen vacancies in the dielectric material layer (here an oxide layer) separating the two electrodes. Alternatively, in resistive random-access memories known as CBRAM (Conductive-Bridging RAM), one of the two electrodes dissolves in the dielectric material and supplies the ions forming the conductive filament. In ReRAM known as PCRAM (Phase-Change RAM), the two electrodes are separated by a programmable region comprising a phase-change material (PCM). This material is able to change from crystalline phase to amorphous phase upon heating. In this type of ReRAM, the OFF state corresponds to the amorphous phase, while the ON state corresponds to the crystalline phase of the programmable region. PCRAM cells may also comprise a heater element inserted between the two electrodes and able to transform the applied voltage pulse in the heat necessary to modify the phase of the programmable region.

During their utilization, arrays of resistive memory or ReRAM cells undergo a great number of set and reset operations. A set operation comprises placing the cell in the LRS and a reset operation comprises placing the cell in the HRS. The application of a set followed by a reset application or vice versa is called a cycle. Both set and reset operations can be performed by applying voltage pulses having opposite polarities.

Arrays of resistive memory cells suffer from variability in the resistance values associated to the HRS and the LRS. FIG. 1 represents (according to a standard deviation scale) the cumulative distribution function (CDF) of the measured electric resistances for the HRS and the LRS in a ReRAM array after different numbers of cycles. For both states, it is apparent that memory cells can have many different resistance values. The dispersion of the HRS and LRS leads to difficulties in distinguishing the two memory states. In other words, resistive memory arrays in which the HRS and LRS are not clearly distinguished may lead to errors in reading the array and thus to resistive memory arrays that are not reliable.

Even if the variability of the $R_{HRS}$ values is higher than the variability of the $R_{LRS}$ values, some efforts must be made to narrow the distribution of resistance values in the LRS.

One of the most used techniques to reduce the variability in the LRS is the full reprogramming of the cell. The full reprogramming technique comprises a reset operation followed by a new set operation. However, some cells may have a particular behavior and need to be treated differently, because the physical mechanism of their filament formation is inherently different. In that case, full reprogramming is not the most effective technique to correctly place a resistive memory cell in the LRS.

Other programming techniques have been proposed to stress more the cell during the set operation, for instance by increasing the voltage pulse duration or amplitude.

Nevertheless, the person skilled in the art does not know which one of these set techniques to use (and when) to obtain a reliable method for programming an array of resistive memory cells.

SUMMARY

There is therefore a need to provide a reliable method for programming an array of resistive memory cells.

According to an aspect of the invention, this need is satisfied by providing a method for programming at least one resistive memory cell of an array of resistive memory cells, the method comprising a sequence of N programming cycles, N being an integer greater than or equal to 2, each programming cycle comprising a set step and a reset step, each set step comprising the application of a set technique chosen among a plurality of set techniques, the method comprising the following steps:
  acquiring a bit error ratio (BER) value corresponding to each programming cycle for each set technique;
  at each programming cycle, applying the set technique having the lowest bit error ratio (BER) value corresponding to the programming cycle.

The programming method establishes an order for the application of the available set techniques, the order being based on a figure of merit of the memory array, and more particularly on the bit error ratio (BER). Thanks to this method, it is possible to apply an adapted sequence of set techniques in order to reduce the dispersion of the low resistance state (LRS). Indeed, the application of different reset techniques makes it possible to deal with the memory cells of the array having a non-ideal behavior and to reduce the bit-to-bit variability.

In an embodiment, each resistive memory cell comprises a resistive memory element and a selection transistor connected in series with the resistive memory element and the plurality of set techniques comprises full reprogramming, applying voltage pulses with increasing amplitudes on a top electrode of the resistive memory element and applying voltage pulses with increasing amplitudes on a gate of the selection transistor.

The plurality of set techniques are, in an embodiment, algorithms comprising set operations, reset operations and read and verify operations.

In an embodiment, the bit error ratio (BER) value corresponding to each programming cycle for each set technique is measured prior to the programming cycles by characterizing a reference array of resistive memory cells and a sequence of the set techniques to be applied during the programming cycles is then defined.

In an alternative embodiment, the bit error ratio (BER) value corresponding to each programming cycle for each set technique is, in an embodiment, acquired from a database.

According to a development of this alternative embodiment, the bit error ratio (BER) value corresponding to each programming cycle for each set technique is measured prior to the programming cycles by characterizing a reference array of resistive memory cells and then stored in the database.

A second aspect of the invention relates to an electronic circuit comprising an array of resistive memory cells and a system (including e.g. one or more electronic circuits) for implementing the programming method according to the first aspect of the invention.

BRIEF DESCRIPTION OF THE FIGURES

Other characteristics and benefits of the invention will become clear from the description that is given thereof below, by way of indication and in no way limiting, with reference to the appended figures, among which.

For greater clarity, identical or similar elements are marked by identical reference signs in all of the figures.

DETAILED DESCRIPTION

Figure 1:
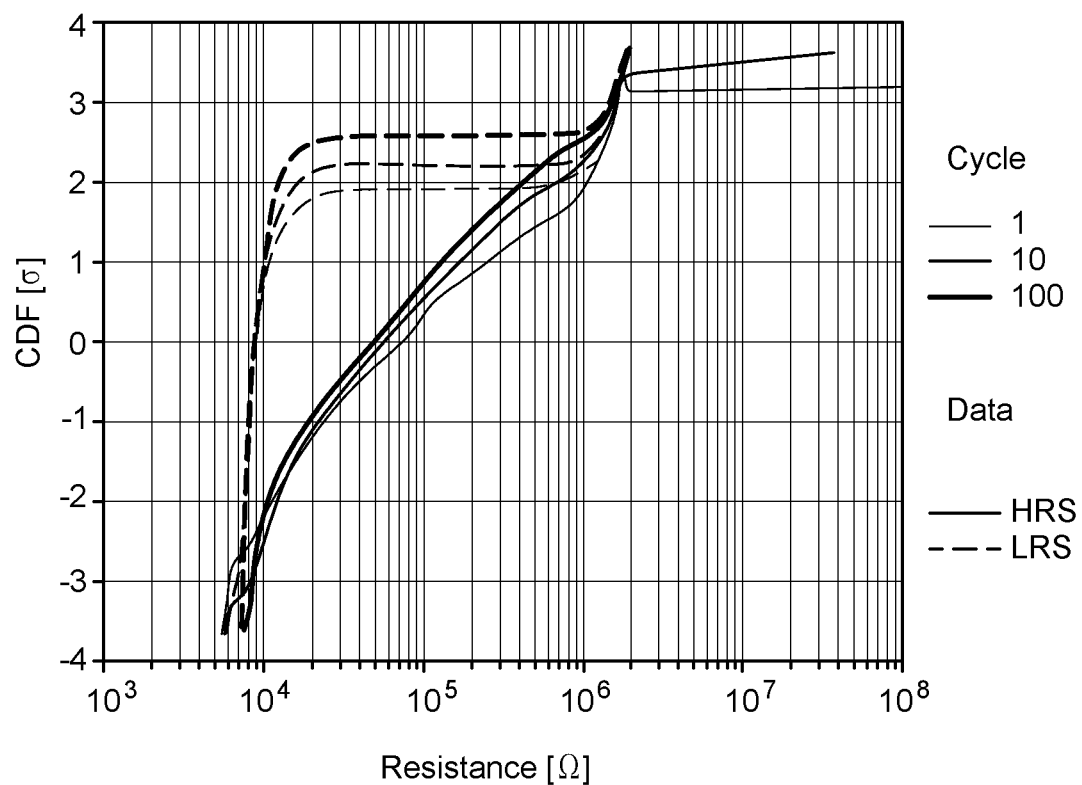
FIG. 1 represents the distribution of the resistance values for an array of resistive memory cells at different programming cycles.
Figure 2:
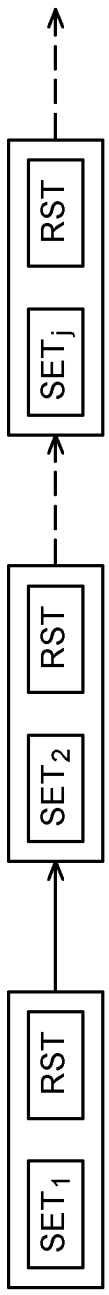
FIG. 2 is a flowchart of a method for programming at least one resistive memory cell, according to an aspect of the invention.

FIG. 2 schematically represents a method 200 for programming an array of resistive memory cells. An array of resistive memory cells comprises a plurality of resistive memory cells arranged in lines and in columns.

Figure 3:
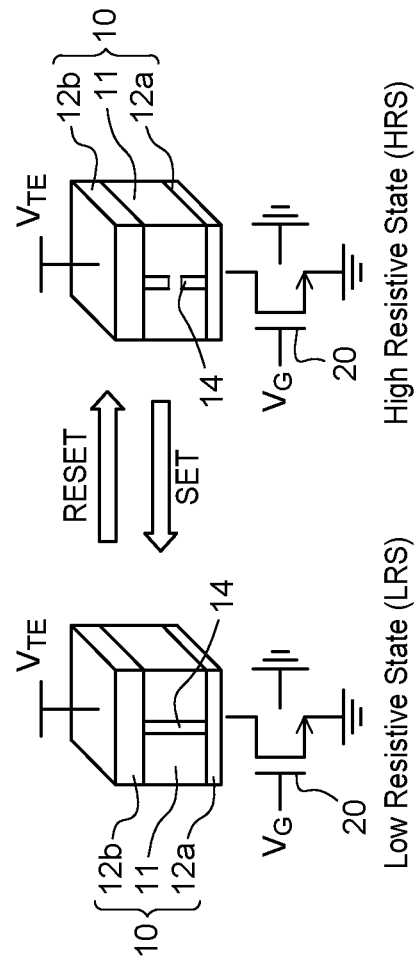
FIG. 3 schematically represents a resistive memory cell switching between a high resistance state (HRS) and a low resistance state (LRS)

As shown on FIG. 3, each resistive memory cell of the array comprises a resistive memory element 10 and a selection transistor 20 connected in series with the resistive memory element 10.

The resistive memory element 10 can switch in a reversible manner between a high resistance state called "HRS" (or OFF state) and a low resistance state called "LRS" (or ON state). These two resistance states make it possible to store an information bit in each memory cell.

The resistive memory element 10 comprises a dielectric material layer 11 arranged between two electrodes:
  a first electrode 12a referred to as "bottom electrode", on which is arranged the dielectric material layer 11; and
  a second electrode 12b referred to as "top electrode" and arranged on the dielectric material layer 11.

The dielectric material layer 11 may also be called "resistive material layer" (since the dielectric material has a variable electrical resistance).

The resistive memory element 10 is desirably a filament-type memory element, that is a memory element wherein the change of resistance state is governed by the formation and the removal of a conductive filament 14 between the two electrodes 12a-12b.

The resistive memory element 10 may be an OxRAM (Oxide-based Random Access Memory) element. The resistive material is then an oxide, for example a transition metal oxide (e.g. $HfO_2$, $Ta_2O_5$, $TiO_2$ ...) or a silicon oxide ($SiO_x$, with x comprised between 1 and 2). The electrodes 12a-12b are electrically conductive layers and may be formed from one or more conductive materials such as titanium, titanium nitride, doped silicon, tungsten, tungsten nitride, metal silicides and platinum.

Alternatively, the resistive memory element 10 may be a CBRAM (Conductive-Bridging Random Access Memory) element. The resistive material is then an ionic conductive and electrically insulating material. One of the electrodes (the cathode) is made of an inert material and the other electrode (the anode) is made of a soluble material.

The resistive memory element 10 may also be a PCRAM (Phase-Change Random Access Memory) or a FeRAM (Ferroelectric Random Access Memory) element.

The memory cells of the array may be subjected, individually or collectively, to programming operations. The programming operations consist in switching the resistive memory element 10 between the high resistive state (HRS) and the low resistive state (LRS). When the resistive memory element 10 changes from the HRS to the LRS, the corresponding programming operation is referred to as a writing or set operation. Conversely, when the resistive memory element 10 changes from the LRS to the HRS, the corresponding programming operation is referred to as an erasing or reset operation. A programming operation can therefore be either a set operation or a reset operation.

The resistive memory element 10 is placed in the HRS when its electrical resistance value is higher than a first resistance threshold $R_{TH\_HRS}$ and in the LRS when its electrical resistance value is lower than a second resistance threshold $R_{TH\_LRS}$. The second resistance threshold $R_{TH\_LRS}$ is lower than or equal to the first resistance threshold $R_{TH\_HRS}$. The ratio between the first and second resistance thresholds is called the "programming window" (PW) of the memory cell:

$$PW = \frac{R_{TH\_HRS}}{R_{TH\_LRS}}$$

It is desirable that the second resistance threshold $R_{TH\_LRS}$ is strictly lower than the first resistance threshold $R_{TH\_HRS}$ (in other words, one resistance threshold per state) in order to have well separated resistance states (for improved reliability).

A memory cell of the array may also be subjected to reading operations. A reading operation consists in measuring the electrical resistance of the resistive memory element 10 in order to determine its resistance state.

The selection transistor 20 serves to bias the resistive memory element 10 so as to program or read the memory cell, and also acts as a current limiter during the set operation so as not to degrade the resistive memory element 10. The drain of the selection transistor 20 is connected to the bottom electrode 12a of the resistive memory element 10.

To perform a set, a reset or a read operation, a first voltage $V_{TE}$ is applied to the top electrode 12b of the resistive memory element 10, a second voltage $V_G$ is applied to the gate of the selection transistor 20 and a third voltage $V_S$ is applied to the source of the selection transistor 20. Values of the top electrode voltage $V_{TE}$, of the gate voltage $V_G$ and of the source voltage $V_S$ depend on the operation to be performed and on the resistive memory technology (type of the resistive memory element, materials and thicknesses of the dielectric layer and of the electrodes).

With reference to FIG. 2, the programming method 200 comprises applying a sequence of N programming cycle $C_j$ to one or more memory cells of the array, N being an integer greater than or equal to 2. An index j, ranging from 1 to N, is used to number the programming cycles of the sequence.

Each programming cycle comprises a step $SET_j$ of setting the memory cell(s) and a step RST of resetting the memory cell(s). The reset steps RST of the sequence may be a conventional reset operation, i.e. the application of one negative voltage pulse between the electrodes 12a-12b of the resistive memory element 10 ($V_{TE}-V_S<0$). The set steps $SET_j$ of the sequence are not performed by simply applying one positive voltage pulse between the electrodes 12a-12b. Each set step $SET_j$ of the sequence comprises the application of a particular set technique. The set steps $SET_j$ are thus optimized set operation.

The set technique applied at the set step SETj of each programming cycle $C_j$ is chosen among a plurality of set techniques. In an embodiment of the programming method 200, the plurality of set techniques comprises:

Full reprogramming;

Verify Set $V_{TE}$: applying voltage pulses with increasing amplitudes on the top electrode 12b of the resistive memory element 10 (the gate voltage $V_G$ and the source voltage $V_S$ being the same at each pulse); and Verify Set $V_G$: applying voltage pulses with increasing amplitudes on the gate of the selection transistor 20 (the top electrode voltage $V_{TE}$ and the source voltage $V_S$ being the same at each pulse), which is equivalent to increasing the compliance current of the memory cell.

These set techniques are algorithms comprising set operations, reset operations and read and verify (R&V) operations (such algorithms are referred to as R&V algorithms).

The full reprogramming set technique comprises applying one or more reprogramming cycles, each reprogramming cycle comprising a reset operation followed by a set operation and a R&V operation. During a R&V operation, the electrical resistance of the cell is measured and compared to the second resistance threshold $R_{TH\_LRS}$. If the electrical resistance of the cell is lower than the second resistance threshold $R_{TH\_LRS}$, the ongoing reprogramming cycle has succeeded, and the algorithm is ended. If the electrical resistance of the cell is higher than the second resistance threshold $R_{TH\_LRS}$, the ongoing reprogramming cycle has failed, and a new reprogramming cycle is performed. The algorithm continues so on until a maximum number of reprogramming cycles is reached (for example 5 reprogramming cycles).

Identical reset conditions are applied during the different reset operations of the reprogramming cycles and identical set conditions are applied during the different set operations of the reprogramming cycles reprogramming cycles. The set and reset conditions are the amplitude and the duration of the voltage pulses applied between the electrodes 12a-12b of the resistive memory element 10 and to the gate of the selection transistor 20. These set and reset conditions are, in an embodiment, standard. For example, for an OxRAM element 10 comprising a bottom electrode 12a made of TiN, a dielectric material layer 11 made of $SiO_x$ and a top electrode 12b made of Ti, the top electrode voltage $V_{TE}$ may be 0 V during each reset operation and 2.8 V during each set operation, the gate voltage $V_G$ may be 4.5 V during each reset operation and 2.5 V during each set operation, the source voltage $V_S$ may be 1.8 V during each reset operation and 0 V during each set operation. The duration of the voltage pulses applied between the electrodes and to the gate of the selection transistor 20 is 1 µs during the reset operations and 100 ns during the set operations.

Figure 4:
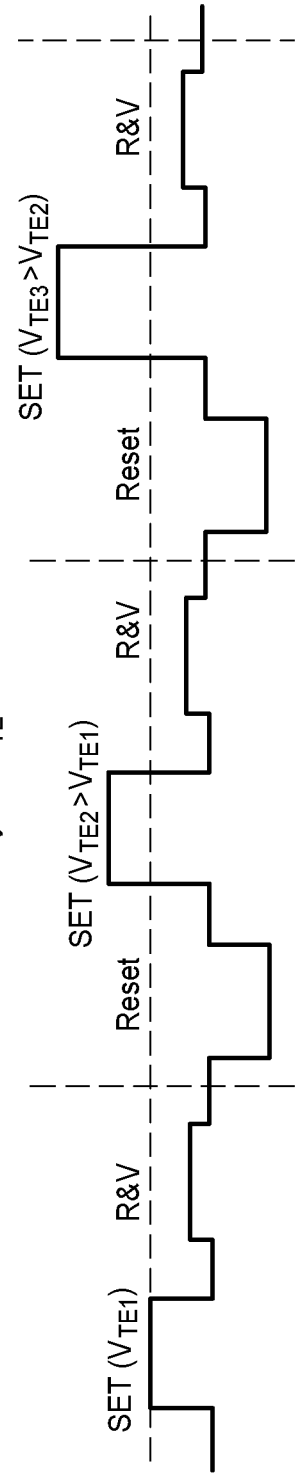
FIG. 4 is a timing diagram of a set technique comprising the application of voltage pulses of increasing amplitude.

FIG. 4 is a diagram showing an embodiment of the second set technique "Verify Set $V_{TE}$" (R&V algorithm increasing the top electrode voltage $V_{TE}$). This second R&V algorithm comprises a first set operation, wherein a first top electrode voltage $V_{TE1}$ is applied to the memory cell(s) to be programmed, and a first R&V operation after the first set operation. If the electrical resistance of the cell is lower than the second resistance threshold $R_{TH\_LRS}$, the first set operation has succeeded, and the algorithm is ended. If the electrical resistance of the cell is higher than the second resistance threshold $R_{TH\_LRS}$, the first set operation has failed, and a reset operation and a new set operation are successively performed. A higher top electrode voltage $V_{TE2}$ ($V_{TE2}>V_{TE1}$) is applied during the new set operation. Then, a new R&V operation is performed. The algorithm continues so on until a maximum top electrode voltage is reached or until a maximum number of set operations is performed.

In other words, the second set technique "Verify Set $V_{TE}$" comprises a first set operation, a first R&V operation and at least one sequence of the reset, set and R&V operations.

The top electrode voltage $V_{TE}$ (during the set operations) is, in an embodiment, increased by steps, according to a staircase. The top electrode voltage $V_{TE}$ starts at a first nominal value and is increased by a first step voltage until it reaches a first end value. The first nominal value (or start value of the $V_{TE}$ staircase) may be comprised between 2.5 V and 2.9 V, the first end value (end value of the $V_{TE}$ staircase) may be comprised between 3.2 V and 3.5 V and the first step voltage may be comprised between 0.05 mV and 0.2 V.

The third set technique "Verify Set $V_G$" may also be, in an embodiment, an algorithm comprising a first set operation, a first R&V operation and at least one sequence of the reset, set and R&V operations. This third algorithm is thus the same as shown on FIG. 4, except that the voltage to be increased during the set operations is the gate voltage $V_G$.

The gate voltage $V_G$ is, in an embodiment, increased by steps, according to a staircase. The gate voltage $V_G$ starts at a second nominal value and is increased by a second step voltage until it reaches a second end value. The second nominal value (or start value of the $V_G$ staircase) may be comprised between 2.0 V and 2.5 V, the second end value (or end value of the $V_G$ staircase) may be comprised between 2.9 V and 3.2 V and the second step voltage may be comprised between 100 mV and 200 mV.

The maximum number of set operations in the second and third R&V algorithms may be comprised between 5 and 10.

The voltage pulse duration during the different set operations of the R&V algorithms is, in an embodiment, constant, for example equal to 100 ns. The voltage pulse amplitude and the voltage pulse duration during the different reset operations of the algorithms are also, in an embodiment, constant, for example respectively equal to 4.5 V and 1 µs.

When the set techniques described above are applied to several memory cells (for example a block of the array to be programmed), most of the cells will receive just one set pulse, because their electrical resistance is good after the first pulse they receive. Only a few cells with receive more than one set pulse (and one or more reset pulses).

The set technique to be used at each programming cycle $C_j$ is selected based on bit error ratio (BER) values corresponding to the programming cycle $C_j$. The bit error ratio (BER) is the arithmetic mean of the number of memory cells not actually being placed in the LRS after a set operation and the number of memory cells not actually being placed in the HRS after a reset operation following or preceding the set operation.

A bit error ratio value corresponding to the programming cycle $C_j$ is thus acquired for each of the set techniques.

In an embodiment, the BER values may be acquired from a database by a controller coupled to the array of resistive memory cells. They are then compared and the set technique having the lowest BER value corresponding to the programming cycle $C_j$ is to applied.

Figure 5:
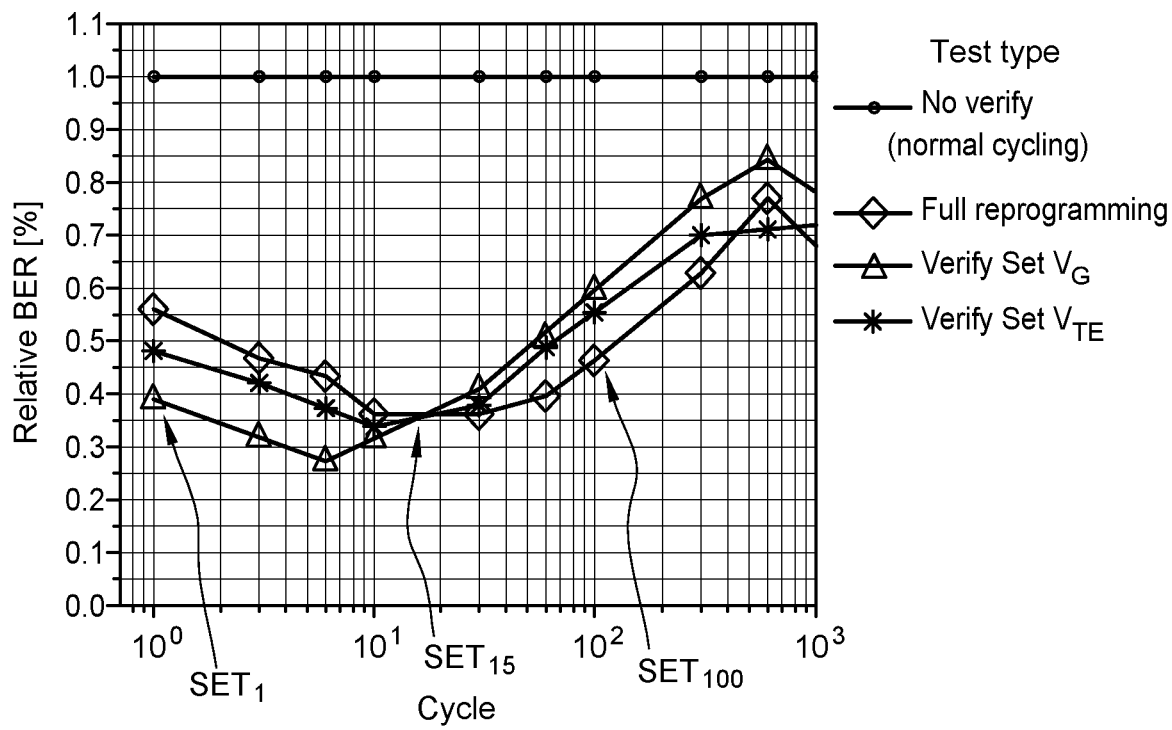
FIG. 5 is an abacus representing the bit error ratio of a reference array as a function of the number of programming cycles of the reference array, for various set techniques used during the set step of the programming cycles.

FIG. 5 shows an example of BER values that may be stored in the database. This figure represents, as a function of the number of programming cycles, the relative BER of the three set techniques described previously. The relative BER of a given set technique is the BER of the technique normalized with respect to the BER obtained when a normal cycling of the cell is performed (standard set and reset operations, no optimized set operation). Thus, it can be seen the benefits in terms of error correction of the three set techniques with respect to a normal cycling.

In this example, the third set technique "Verify Set $V_G$" (increasing the gate voltage $V_G$) has the lowest (relative) BER values in the first cycles. It is then chosen as the set technique to be applied during the first programming cycles $C_j$ of the array (see for example SETT on FIG. 5). Then, after approximatively ten cycles, the second set technique "Verify Set $V_{TE}$" (increasing the top electrode voltage $V_{TE}$) become more effective. It is then chosen as the set technique to be applied during the following programming cycles Cj (see for example $SET_{15}$). Then, between (approximatively) the $20^{th}$ cycle and the $400^{th}$ cycle, the full reprogramming technique has the lowest BER value and is selected (see for example $SET_{100}$).

The different BER values for the different set techniques and at each programming cycle are measured during a preliminary characterizing step (prior to the programming cycles) and then stored in the database. A reference array of resistive memory cells (of the same resistive memory technology than the array to be programmed) is subjected to a high number of programming cycles (for example more than $10^4$), each programming cycles comprising a reset step and a set step according to the considered set technique, as indicated above. The BER is calculated at each programming cycle, by measuring and averaging the number of LRS fails (i.e. the number of memory cells of the reference array not actually being placed in the LRS after the set step) and the HRS fails (the number of memory cells not actually being placed in the HRS after the reset step).

In another embodiment, the different BER values for the different set techniques and at each programming cycle are measured prior to the programming cycles during the characterizing step, then the sequence of the set techniques to be applied during the programming cycles is defined (based on the lowest BER values). The sequence may be stored in the controller (coupled to the array of resistive memory cells) or in a database in communication with the controller.

Figure 6:
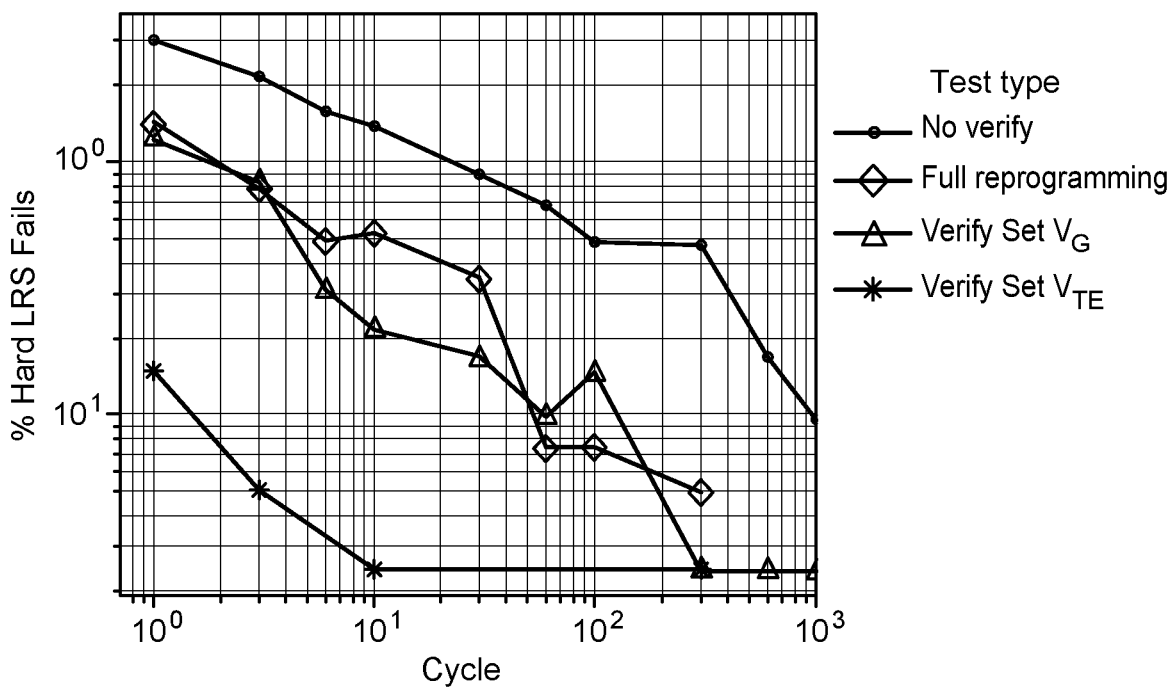
FIG. 6 represents, as a function of the number of programming cycles of the reference array, the capability of correcting the hard fails for the same set techniques.

FIG. 6 show the percentage of the memory cells of the reference array in a hard fail situation, as a function of the number of programming cycles. It is considered that a memory cell of the reference array is in a hard fail situation when its LRS resistance value (i.e. the electrical resistance after a set step) exceeds a threshold (much higher than the second resistance threshold $R_{TH\_LRS}$, for example equal to $10*R_{TH\_LRS}$.

This figure shows that the second set technique "Verify Set $V_{TE}$" is the fastest method to correct the hard fails (for this reference array, almost all hard fails are corrected after ten programming cycles). The second set technique "Verify Set $V_{TE}$" is then an effective method for setting memory cells that have been deeply reset (memory cells that have a wide conductive filament).

Figure 7:
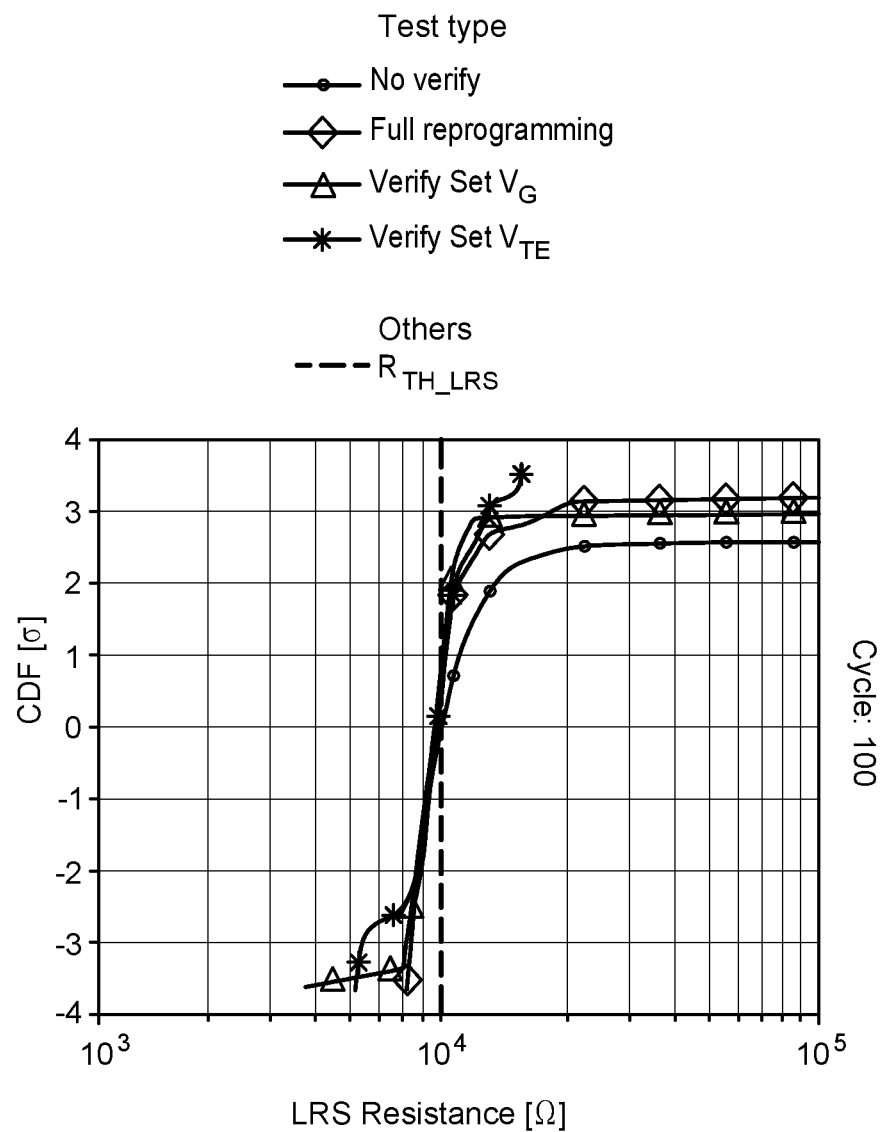
FIG. 7 represents the distribution of the LRS resistance values of the reference array, after hundred programming cycles and for the same set techniques used during the set step of the programming cycles.

FIG. 7 show the effects of the different set techniques on the distribution of the LRS resistance values, after 100 programming cycles of the reference array. This figure shows that the third set technique "Verify Set $V_G$" has a more pronounced effect of shifting the resistance distribution towards to low resistance values. Thanks to this technique, a significant amount of memory cells having a resistance slightly higher than the second resistance threshold $R_{TH\_LRS}$, here equal to $10^4\Omega$, are corrected (at the $100^{th}$ programming cycles). It can be also seen the effect of the second set technique "Verify Set $V_{TE}$" on the high resistance tail of the LRS resistance distribution.

The programming method according to the invention optimally combine several set techniques having different effect on the behavior of the memory cells (in particular on the formation of the conductive filament) to improve the LRS resistance distribution and improve the bit error ratio of the array.

The plurality of set techniques may comprise other set techniques than those described above, for example applying pulses with increasing duration to the top electrode of the resistive memory element. The second and third set techniques (Verify Set $V_{TE}$ and Verify Set $V_G$) may comprise another sequence of the set, reset and R&V operations. For example, a R&V operation may also follow each reset operation.

Another aspect of the invention relates to an electronic circuit comprising an array of resistive memory cells (OxRAM, CBRAM, PCRAM, FeRAM) and a system for implementing the programming method of FIG. 2. The system for implementing the programming may include one or more electronic circuits.

In an embodiment, the electronic circuit comprises:

a power source configured to generate voltage pulses;

an addressing circuit configured to apply the voltage pulses to the top electrode 12b of the memory resistive element, to the source of the selection transistor 20 and to the gate of the selection transistor 20;

a non-volatile memory storing bit error ratio (BER) values corresponding to the different set techniques; and a controller configured (or programed) to retrieve from the memory the BER values corresponding to the different set techniques, to compare the bit error ratio values at each programming cycle, to determine the set techniques having the lowest BER and to send control signals to the power source so that it generates the voltage pulses corresponding to the set techniques having the lowest BER.

In an alternative embodiment, the electronic circuit comprises:

a power source configured to generate voltage pulses;

an addressing circuit configured to apply the voltage pulses to the top electrode 12b of the memory resistive element, to the source of the selection transistor 20 and to the gate of the selection transistor 20;

a controller configured (or programed) to send control signals to the power source so that it generates the voltage pulses in accordance with a sequence of the set techniques.

The sequence of the set techniques may be stored in a non-volatile memory.

The power source may comprise one or more voltage generators, in an embodiment at least one variable voltage generator capable of generating pulses of increasing amplitude.

The addressing circuit may comprise multiplexers, bit lines (connected to top electrodes 12b of the resistive memory elements 10 of the array), word lines (connected to the gate of the selection transistors 20 of the array) and, in an embodiment, source lines (connected to the source of the selection transistors 20).

The non-volatile memory is for example a read-only memory (ROM) or a Flash memory. It may be internal or external to the controller.

The invention claimed is:

1. A method for programming at least one resistive memory cell of an array of resistive memory cells, said method comprising a sequence of N programming cycles, N being an integer greater than or equal to 2, each programming cycle comprising a set step and a reset step, each set step comprising application of a set technique chosen among a plurality of set techniques, wherein each resistive memory cell comprises a resistive memory element and a selection transistor connected in series with the resistive memory element and wherein the plurality of set techniques comprises:

full reprogramming: said full reprogramming comprising applying at least on reprogramming cycles, each reprogramming cycle comprising a reset operation followed by a set operation followed by a read and verify operation; and verify Set $V_{TE}$: said verify Set $V_{TE}$ comprises applying voltage pulses with increasing positive amplitudes on a top electrode of the resistive memory element; and verify Set $V_G$: said verify Set $V_G$ comprises applying voltage pulses with increasing positive amplitudes on a gate of the selection transistor;

said method comprising the following steps:

acquiring a bit error ratio value corresponding to each programming cycle for each set technique of said plurality of set techniques;

at each programming cycle, applying the set technique having a lowest bit error ratio value corresponding to said programming cycle.

2. The method according to claim 1, wherein the plurality of set techniques are algorithms comprising set operation, and reset operations, and read and verify operations.

3. The method according to claim 1, wherein the bit error ratio value corresponding to each programming cycle for each set technique is measured prior to the programming cycles by characterizing a reference array of resistive memory cells and a sequence of the set techniques to be applied during the programming cycles is then defined.

4. The method according to claim 1, wherein the bit error ratio value corresponding to each programming cycle for each set technique is acquired from a database.

5. The method according to claim 4, wherein the bit error ratio value corresponding to each programming cycle for each set technique is measured prior to the programming cycles by characterizing a reference array of resistive memory cells and then stored in the database.

6. An electronic circuit comprising an array of resistive memory cells and a system for implementing the programming method according to claim 1, wherein each resistive memory cell comprises a resistive memory element and a selection transistor connected in series with the resistive memory element, said system comprising:

a power source configured to generate voltage pulses;

an addressing circuit configured to apply the voltage pulses:

to the top electrode of at least a memory resistive element of the array of resistive memory cells; and to the gate of the selection transistor; and a controller configured to send control signals to the power source so that it generates the voltage pulses corresponding to the set techniques having the lowest bit error rate.

7. A method for programming at least one resistive memory cell of an array of resistive memory cells, said method comprising a sequence of N programming cycles, N being an integer greater than or equal to 2, each programming cycle comprising a set step and a reset step, each set step comprising application of a set technique chosen among a plurality of set techniques, wherein each resistive memory cell comprises a resistive memory element and a selection transistor connected in series with the resistive memory element and wherein the plurality of set techniques comprises:

full reprogramming: said full reprogramming comprising applying at least on reprogramming cycles, each reprogramming cycle comprising a reset operation followed by a set operation followed by a read and verify operation; and verify Set $V_{TE}$: said verify Set $V_{TE}$ comprises applying voltage pulses with increasing positive amplitudes on a top electrode of the resistive memory element; and verify Set $V_G$: said verify Set $V_G$ comprises applying voltage pulses with increasing positive amplitudes on a gate of the selection transistor;

said method comprising the following steps:

acquiring a bit error ratio value corresponding to each programming cycle for each set technique of said plurality of set techniques;

at each programming cycle, applying the set technique having a lowest bit error ratio value corresponding to said programming cycle, wherein the bit error ratio value corresponding to each programming cycle for each set technique is measured prior to the programming cycles by characterizing a reference array of resistive memory cells and a sequence of the set techniques to be applied during the programming cycles is then defined.

8. A method for programming at least one resistive memory cell of an array of resistive memory cells, said method comprising a sequence of N programming cycles, N being an integer greater than or equal to 2, each programming cycle comprising a set step and a reset step, each set step comprising application of a set technique chosen among a plurality of set techniques, wherein each resistive memory cell comprises a resistive memory element and a selection transistor connected in series with the resistive memory element and wherein the plurality of set techniques comprises:

full reprogramming: said full reprogramming comprising applying at least on reprogramming cycles, each reprogramming cycle comprising a reset operation followed by a set operation followed by a read and verify operation; and verify Set $V_{TE}$: said verify Set $V_{TE}$ comprises applying voltage pulses with increasing positive amplitudes on a top electrode of the resistive memory element; and verify Set $V_G$: said verify Set $V_G$ comprises applying voltage pulses with increasing positive amplitudes on a gate of the selection transistor;

said method comprising the following steps:

acquiring a bit error ratio value corresponding to each programming cycle for each set technique of said plurality of set techniques;

at each programming cycle, applying the set technique having a lowest bit error ratio value corresponding to said programming cycle, wherein the bit error ratio value corresponding to each programming cycle for each set technique is acquired from a database, and wherein the bit error ratio value corresponding to each programming cycle for each set technique is measured prior to the programming cycles by characterizing a reference array of resistive memory cells and then stored in the database.

* * * * *